(12) United States Patent
Jitaru (10) Patent No.: US 6,466,454 B1
(45) Date of Patent: Oct. 15, 2002

(54) COMPONENT TRANSFORMER

(75) Inventor: Ionel Jitaru, Tucson, AZ (US)

(73) Assignee: Ascom Energy Systems AG, Berne (CH)

( * ) Notice: Subject to any disclaimer, the term of this patent is extended or adjusted under 35 U.S.C. 154(b) by 0 days.

(21) Appl. No.: 09/313,939

(22) Filed: May 18, 1999

Related U.S. Application Data (63) Continuation-in-part of application No. 09/086,365, filed on May 28, 1999, now Pat. No. 5,973,923.

(51) Int. Cl.⁷ .......................... H01F 27/06; H05K 1/14; H05K 1/18
(52) U.S. Cl. ................ 361/836; 361/761; 361/767; 361/782; 361/802; 361/803; 361/818; 336/200
(58) Field of Search ................. 361/719, 720, 361/748, 760, 761, 762, 764, 767, 768, 780, 781, 782, 783, 792, 793–796, 802–804, 807–811, 818, 820, 821, 836; 336/200, 205, 232; 333/12, 185, 246, 247

(56) References Cited

U.S. PATENT DOCUMENTS

| | | | |
|---|---|---|---|
| 3,681,526 A | | 8/1972 | Camras |
| 5,036,428 A | | 7/1991 | Brownhill et al. |
| 5,469,334 A | * | 11/1995 | Balakrishnan ............... 361/782 |
| 5,521,573 A | * | 5/1996 | Inoh et al. ................... 336/200 |
| 5,525,941 A | * | 6/1996 | Roshen et al. ............... 336/200 |
| 5,565,837 A | * | 10/1996 | Godek et al. ................. 336/232 |
| 5,576,934 A | | 11/1996 | Roethlingshoefer |
| 5,581,443 A | | 12/1996 | Nakamura et al. |
| 5,604,673 A | * | 2/1997 | Washburn et al. ........... 361/782 |
| 5,636,110 A | | 6/1997 | Lanni |
| 5,949,191 A | * | 9/1999 | Cassese et al. .............. 336/200 |
| 5,990,776 A | * | 11/1999 | Jitaru .......................... 336/200 |
| 6,069,548 A | * | 5/2000 | Baarman et al. ............. 336/200 |
| 6,124,778 A | * | 9/2000 | Rowley et al. .............. 336/200 |
| 6,239,683 B1 | * | 5/2001 | Roessler et al. ............. 336/200 |
| 6,262,649 B1 | * | 7/2001 | Roessler et al. ............. 336/200 |

FOREIGN PATENT DOCUMENTS

| JP | 3-78218 | * | 4/1991 |
|---|---|---|---|
| JP | 3-181191 | * | 8/1991 |

\* cited by examiner

*Primary Examiner*—Kamand Cuneo
*Assistant Examiner*—John B. Vigushin
(74) *Attorney, Agent, or Firm*—Birdwell, Janke & Durando, PLC

(57) ABSTRACT

A new packaging technology which improves the electrical and mechanical performance of the circuits using magnetic elements. High frequency current loops generate electromagnetic fields which are radiated or induce high frequency current in the rest of the circuit. To reduce the radiated field, these loops have been minimized by locating the high frequency switching components close to each other and very close to the magnetic elements. By separating the high frequency switching electronic components from the rest of the electronic components and locating them on the same multilayer PCB where the magnetic element is constructed, optimal results are obtained.

14 Claims, 13 Drawing Sheets

COMPONENT TRANSFORMER

This is a continuation-in-part of U.S. patent application Ser. No. 09/086,365, filed on May 28, 1999, now U.S. Pat. No. 5,173,923 and entitled "Packaging Power Converters."

BACKGROUND OF THE INVENTION

The invention relates to packaging electrical components for converters and power magnetics.

Figure 1:
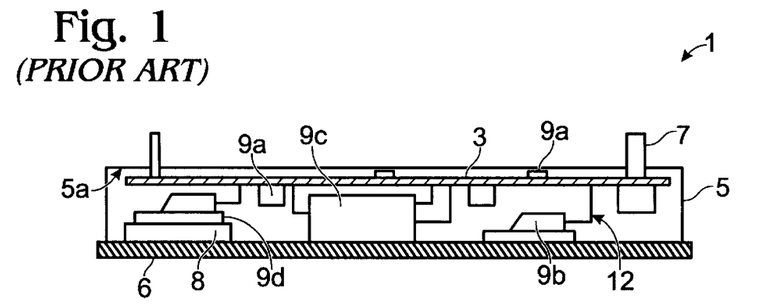
FIG. 1 is a cross-sectional side view of prior art components packaging.

One approach to packaging electric components in power converters (FIG. 1) includes providing a structure 1 having a housing which encloses both the components and the means by which heat is extracted from the components. The housing includes a non-conductive casing 5 and an aluminum heat-sinking base. A printed circuit board (PCB) 3 is mounted next to the upper wall 5a of the casing. Conductive pins 7 are attached directly to the PCB 3 and extend up through the wall 5a. Electronic components 9a, 9c are mounted to one or both sides of the PCB 3. Larger size components such as the transformer 9c are mounted to the lower side where space is available. Power-dissipating devices such as 9b are mounted directly on the base-plate 6 for better heat transfer. Power components 9b are electrically connected to the PCB by leads 12. Some of the power-dissipating devices 9d are attached to the base-plate by means of a thermally conductive insulator material 8. Structure 1 may be filled with an encapsulant, which acts as a heat spreader and provides mechanical support. In the case where a hard epoxy encapsulant is used, a "buffer coating" material is used to protect some of the components.

However, there is a need for improved transformers.

SUMMARY OF THE INVENTION

The present invention provides for many improvements in the field of transformer layout and construction.

In one embodiment of the invention, a new packaging technology which improves the electrical and mechanical performance of circuits using magnetic elements is provided. In this embodiment, high frequency current loops generate electromagnetic fields, which are radiated, or induce high frequency current in the rest of the circuit. To reduce the radiated field, the extent of these loops is minimized by locating the high frequency switching components close to each other and very close to the magnetic elements. By separating the high frequency switching electronic components from the rest of the electronic components and locating them on the same multilayer PCB where the magnetic element is located, optimal results are obtained.

The invention provides a packaging technology for power converters and power magnetics that is compact, inexpensive, and easy to manufacture. The invention features a package for electrical components on a circuit board. In this packaging concept most of the power magnetic elements are integral to the multilayer PCB. The windings of the magnetic elements such as transformers, inductors, and in some cases signal transformers are incorporated in the multilayer PCB, with the top and bottom layers providing support for electronic components. In this way the footprint of the magnetic elements is reduced to the footprint of the transformer core. The power-dissipating devices are placed on pads, which have a multitude of copper plated vias to the other side of the PCB. The heat transferred to the other side of the PCB can be further spread using a larger pad, or transferred to a metallic base-plate attached to the PCB through an isolating material. Due to the limited surface of the heat spreader, an additional heat sink may be attached to the heat spreader to increase its cooling area.

The unique aspect of this packaging concept is the fact that the magnetic element's windings are incorporated on the multilayer PCB construction which also serves as a support for power-dissipating components and some of the control components. The heat from the power-dissipating components is extracted through copper plated vias which transfer the heat to the other side of the PCB. The heat is further transferred to a metal base-plate connected to the PCB by means of a thermally conductive insulator. For airflow cooling applications the heat spreader connected to the thermal vias can serve as a cooling surface. A heatsink can also be attached to the heat spreader to increased the heat dissipation area.

The new packaging technology of this invention improves the electrical and mechanical performance of circuits which include magnetic elements.

Switched mode power processing converters employ high frequency currents. High frequency current loops are created by high frequency switching electronic components and the interconnection paths between them.

The high frequency current loops generate electromagnetic fields, which are radiated and induce high frequency current in the rest of the circuit. To reduce the radiated field these loops should be as small as possible. As a result the high frequency switching components are located close to each other and very close to the magnetic elements. This is achieved more particularly by separating the high frequency switching electronic components from the rest of the electronic components and locating the high frequency switching electronic components on the same multilayer PCB carrying the magnetic elements. The multilayer PCB which incorporates the winding of the magnetic element contains more layers than most of the multilayer PCBs which serve as support and interconnection between electronic components.

To reduce the cost of the assembly it is desirable to reduce the cost of the multilayer PCB that incorporates the magnetic elements. This multilayer PCB that contains the magnetic element and the high frequency switching electronic components is herein referred to as the power PCB. The multilayer PCB that accommodates the rest of the electronic components is referred to as the mother PCB. The high frequency switching electronic components are located on the power PCB close to each other and close to the magnetic element. As a result the size of the high frequency current loop can be significantly reduced. The interconnection between the power PCB and the mother PCB will carry lower frequency currents. This package concept leads to better electrical performance while providing an economical utilization of expensive multilayer PCBs.

According to the invention, the electronic components are located very close to the magnetic elements in order to minimize the size of current loops through the magnetic elements.

The invention, together with various embodiments thereof, will be more fully explained by the accompanying drawings and the following descriptions thereof.

DESCRIPTION OF PREFERRED EMBODIMENT

Figure 2:
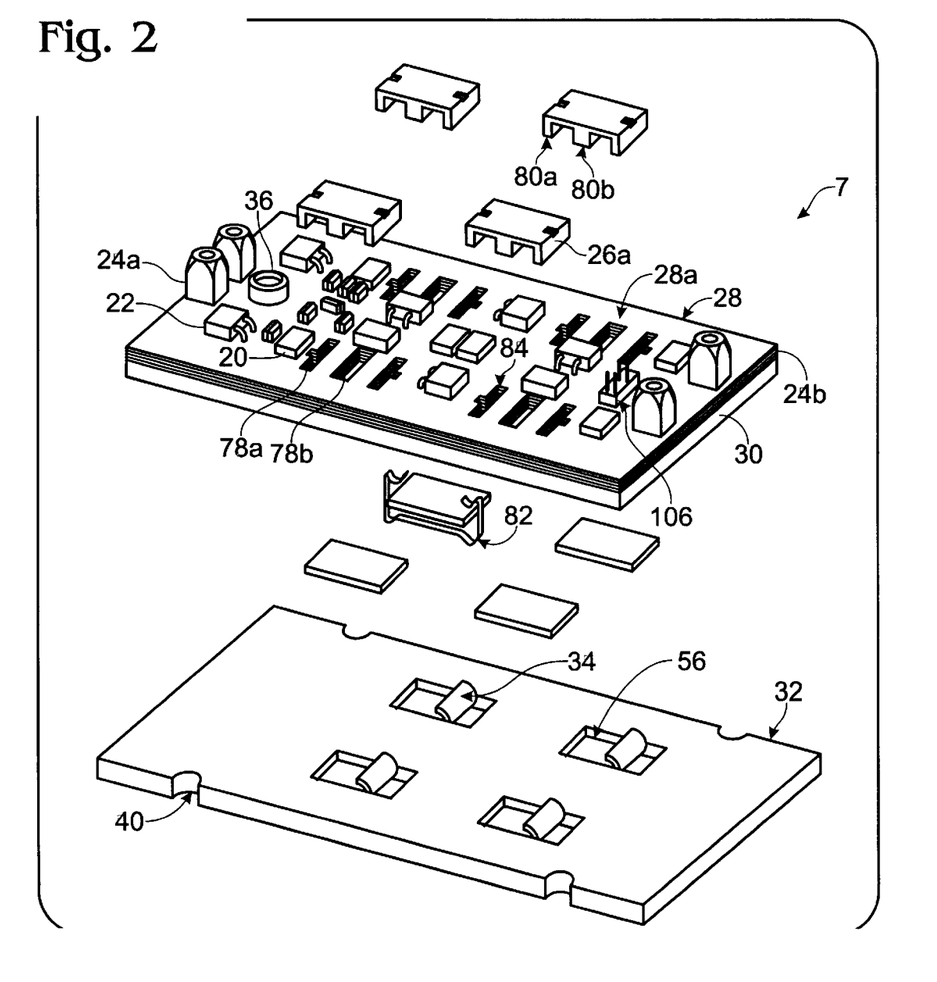
FIG. 2 is a perspective exploded view of component packaging according to the invention.
Figure 4A:
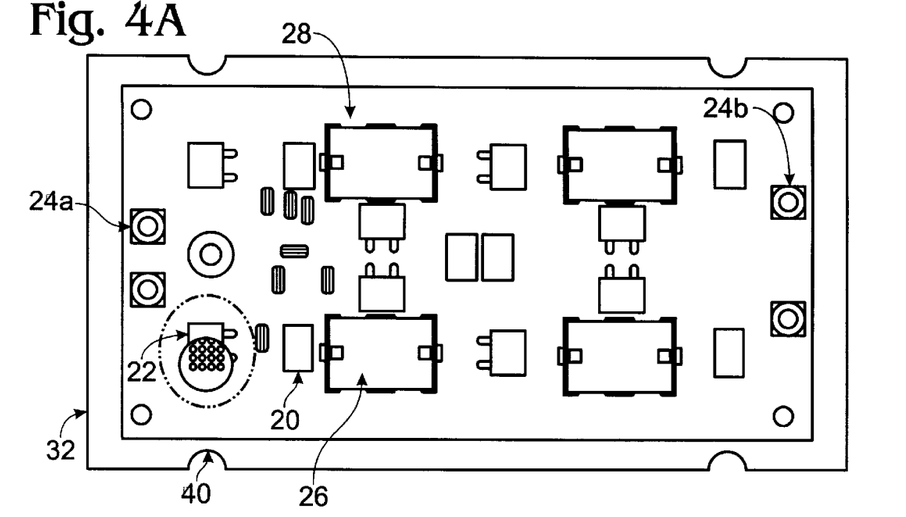
FIG. 4A is a top view of the packaging with a detailed section of cooling vias.
Figure 4B:
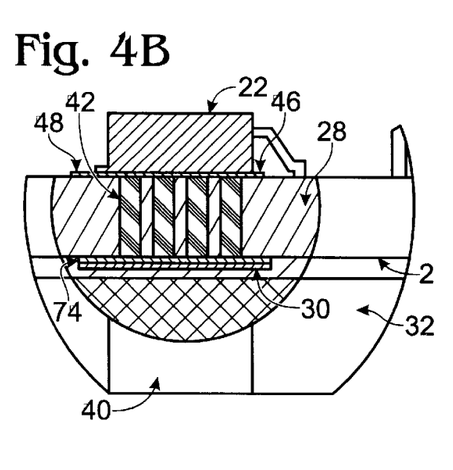
FIG. 4B is a section of the cooling vias of FIG. 4C.

Referring to FIG. 2 showing a packaging structure 7 according to the invention, power-dissipating electronic components 22 are located on a multilayer PCB 28 on top of a heat spreader pad 48 (FIG. 4B). The heat spreader pad is connected to one or more copper plated vias 42. A heat spreader 74 (FIG. 4B) is connected to the bottom of the PCB through copper plated vias. The copper plated vias can be filled with solder or can be empty in which case the heat will be transferred through the metalization on the walls of the vias. The metalization is a copper deposit formed in a plating process associated with the manufacturing process of the PCB. The vias can also be filled with a thermally conductive material 30a as shown in FIG. 4D. The material 30a is introduced into the vias under pressure to fill the vias. An insulator material 30 with good thermal conductivity characteristics is placed between PCB 28a and a metal base-plate 32. Heat from the power-dissipating components 22 is thereby transferred though the heat spreader pad 48, on which the power-dissipating device is mounted, through the copper plated vias 42 to the other side of PCB 28a, to the heat spreader 74. The heat is further transferred through the thermally conductive insulator material 30 to the base-plate 32. Where the insulator material 30a penetrates through the copper plated vias 42, surface contact increases, and as a result the thermal transfer from the heat spreader pad 48 to the metal plate 32 is improved.

Figure 3A:
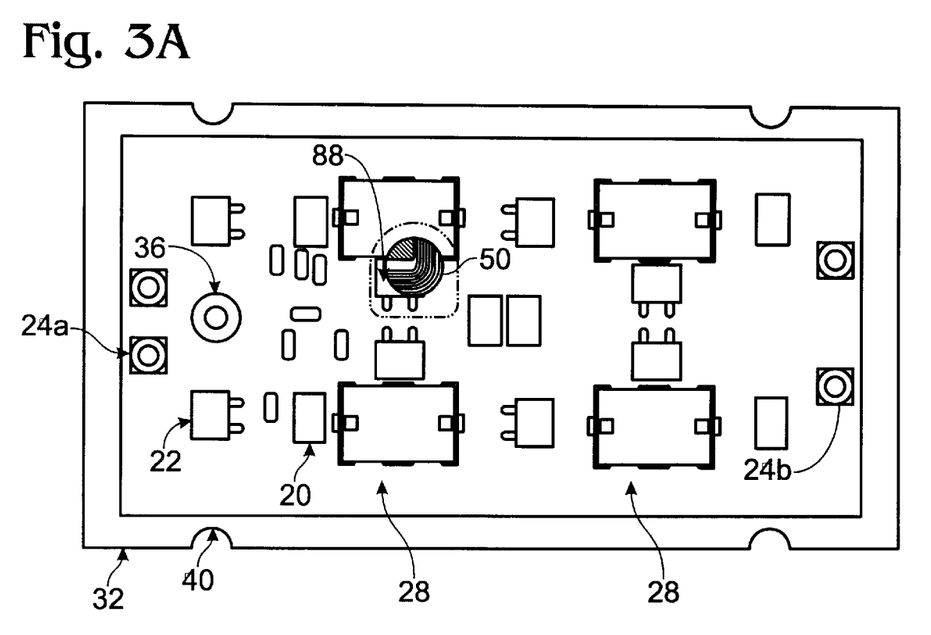
FIG. 3A is a top view of the packaging with a detailed section of the magnetic winding.
Figure 3B:
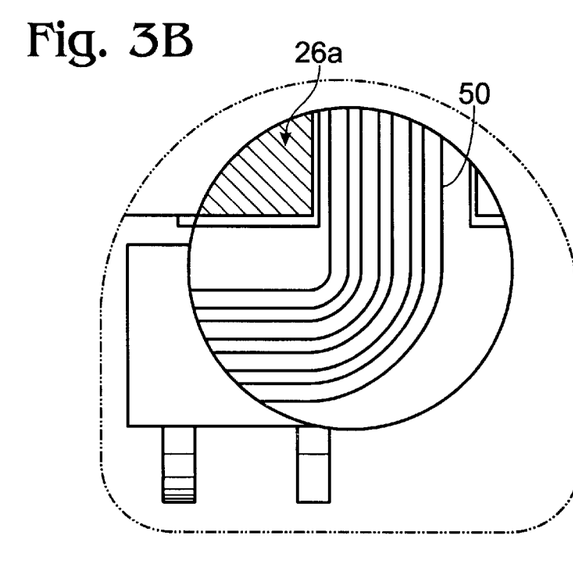
FIG. 3B is an enlarged view of a section of FIG. 3A.

An outstanding feature of the packaging 7 is the incorporation of magnetic elements implementation in the multilayer PCB and the means by which heat is transferred to the base-plate 32 from the power-dissipating devices, the magnetic winding 50, (FIGS. 3A and 3B), the magnetic cores 26a and 26b, and the low power dissipation devices 20. To increase power density, some components 88 (FIG. 3A) are mounted on top of the multilayer PCB 28a, above the windings 50 embedded in the inner layers of the multilayer PCB 28. In this way the footprint of the magnetic element is reduced to the footprint of the magnetic core 26a.

Prior art magnetic elements such as transformers and inductors are discrete devices which are connected to the PCB by means of through-hole or surface-mounted pins. The presence of the connecting pins increases the cost of the magnetic element and reduces the reliability of the magnetic device due to mechanical failure of the pins. The interconnection pins can be bent or broken easily. The presence of the interconnection pins adds supplementary stray inductance in series with the transformer, which negatively impacts the electrical performance of the circuit. In most applications the energy contained in this parasitic inductance is dissipated. However, reducing the parasitic inductance can increase voltage or current stress on the electrical components.

Another outstanding feature of packaging 7 is that it allows the use of more complex winding arrangements and more magnetic elements in the same multilayer PCB construction. The interconnections of these magnetic elements are also made within the multilayer PCB. The packaging 7 structure may contain a number of smaller magnetic elements achieving a low profile package. The magnetic cores 26a and 26b penetrate through the multilayer PCB by means of the cutouts 78a and 78b adapted to receive outer legs 80a and inner legs 80b (FIG. 2). The magnetic cores 26a and 26b can be glued together or attached by means of spring clips 82. To accommodate the spring clips additional cutouts in the PCB 28 are provided. Cutouts 86 are made through the insulator material 30 to accommodate magnetic cores 26b. In most applications the thickness of the insulator material is less than the height of the magnetic core. To accommodate the magnetic core 26b, cavities 56 (FIG. 4C) are produced in the base-plate 32. Due to fragility of the magnetic cores, a soft pad 34 (FIG. 4C) with low thermal impedance is placed under the magnetic core 26b in the cavity. The pad dampens the vibration of the magnetic core, The low thermal impedance of the pad 34 also offers a cooling path for the magnetic core. In applications where electrical isolation from the base plate is required, the pad preferably has insulation properties.

The entire structure 7 is pressed together so that the magnetic core 26b is placed on top of the soft pad 34. The thickness of the pad is chosen so that the metallic plate 32 makes good contact with the insulator 30. Permanent attachment of the insulator material 30 can be made in several ways. In the preferred embodiment the insulator material 30 has adhesive properties resulting from a curing process at high temperature, thereby adhering the insulator to the PCB 28 and base-plate 32.

Figure 4C:
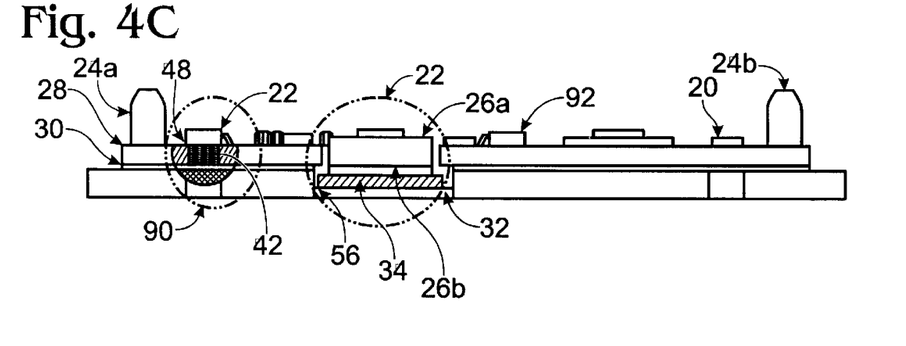
FIG. 4C is a section of the packaging through the cooling vias and through a magnetic element.
Figure 4D:
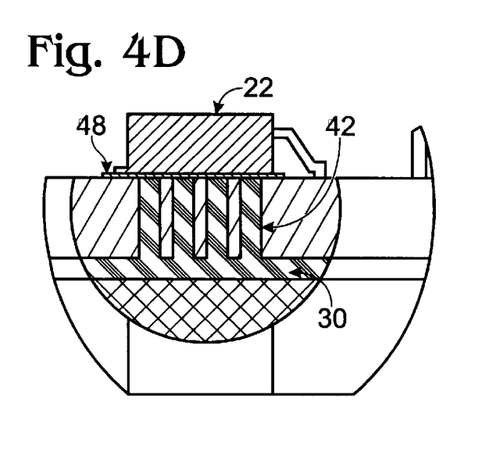
FIG. 4D is a section of the cooling vias of FIG. 4C wherein the insulator material penetrates the vias.

A section 90, including a power-dissipating device on top of the heat spreader 48 and copper plated cooling vias 42 is shown in FIG. 4C. The vias 42 transfer heat to the heat spreader 74. The heat is further transferred by means of the thermally conductive insulator 30 to the metal plate 32.

Also shown in FIG. 4C, a structure 92 includes the upper section of the magnetic core 26a, the bottom section of the magnetic core 26b, and a pad 34 under the magnetic core 26b, in the cavity 56. The heat generated in the magnetic cores 26 is transferred to the base-plate through the pad 34. For components which require maintaining a temperature close to that of the base-plate, one or more copper plated vias are placed under the components or in thermal connection to the traces or pads connected to the components. In this way low thermal impedance to the base-plate is achieved.

Screws, clips, or different means of applying pressure to the structure 7 can also be used to attach the PCB 28 to the insulator 30 and the base-plate 32. In some applications the cavities 56 in the base-plate 32 can penetrate through the plate to become cutouts. For protecting the magnetic cores 26b, soft epoxy material can be used to cover the remaining cavity in between the magnetic core and the surface of the base plate 32. In some applications the cavity can be left open.

Figure 8:
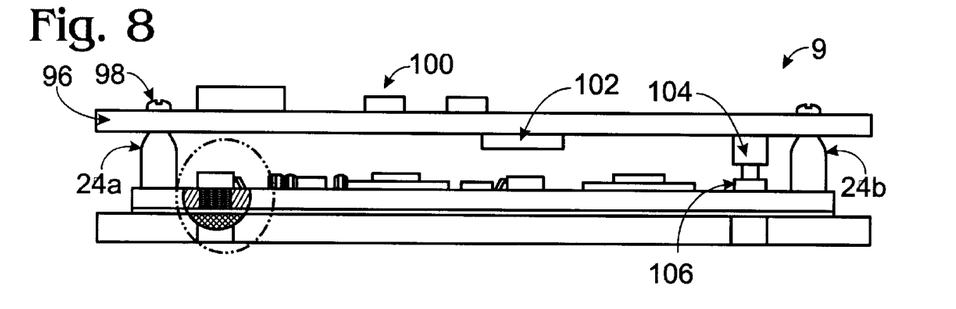
FIG. 8 is a cross-section of the packaging connected to the motherboard.

FIG. 8 shows a structure 9 wherein a motherboard 96 is attached to the package 7 of FIG. 4C. The attachment is made through power connectors 24a and 24b, and screws 98. A signal connector 106, located on the structure 7, is adapted for connection to a matching signal connector 104 located on the motherboard 96. More than one structure 7 can be connected to the same motherboard 96. There may be additional components 100 and 102. The structure is advantageous for systems in which only the power train and some control functions are located on the structure 7, whereas other control function components, as well as supplementary logic circuits and EMI filters, are located on the motherboard. Noise sensitive components are located on the motherboard, whereas the power-dissipating components, some control components and the magnetics are located on the structure 7. The bottom layer of the motherboard 96 may contain copper shields to further protect the noise sensitive components.

Figure 5A:
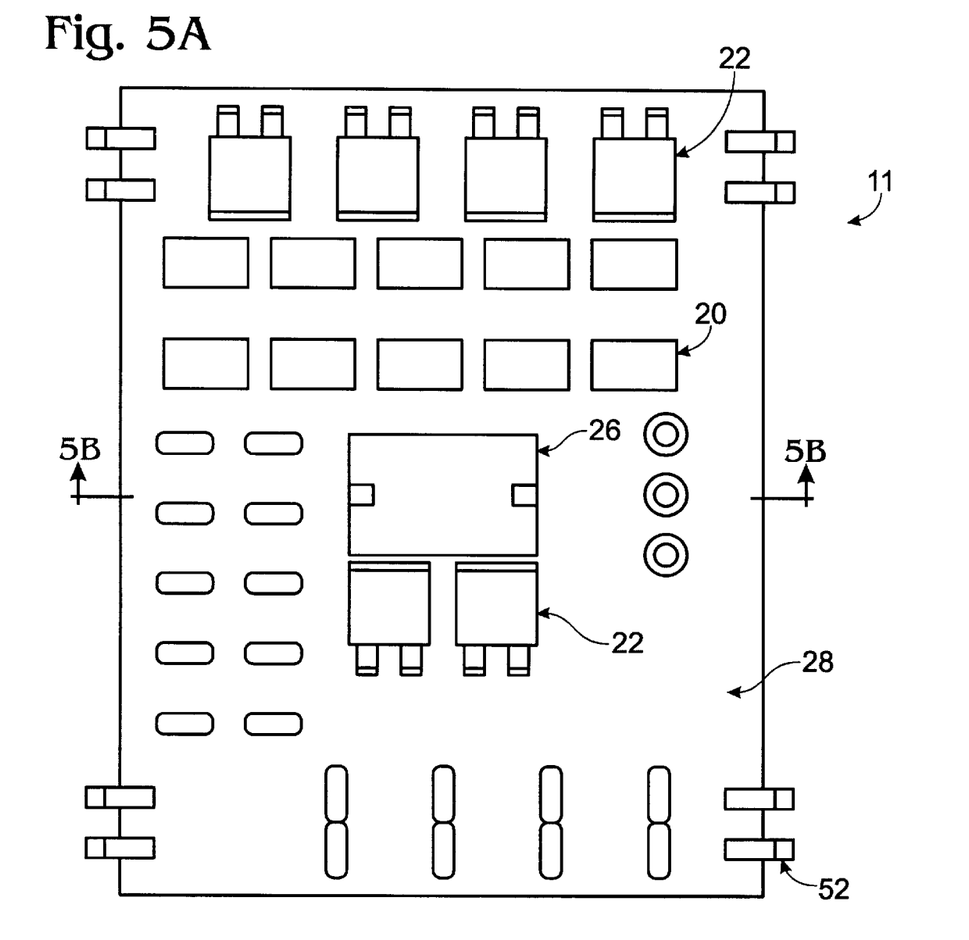
FIGS. 5A and 5B are views of the horizontal packaging with airflow cooling.
Figure 5B:
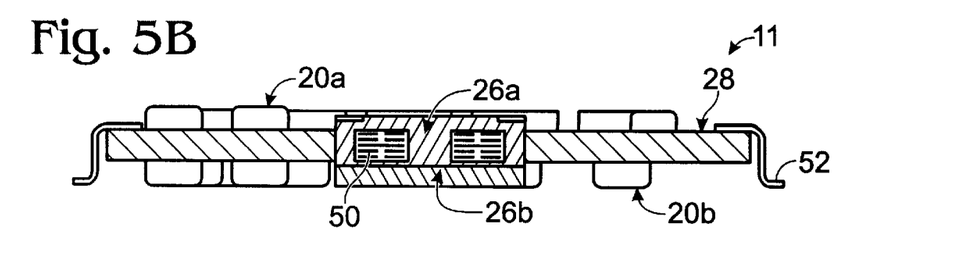

FIGS. 5a and 5b show a packaging structure 11. In this structure the magnetic element has its winding 50 embedded within the multilayer PCB 28 as in the structure 7. The components are preferably located on both sides of the multi layers PCB. This packaging structure is advantageous in low power dissipation applications where airflow is available. The entire surface of multilayer PCB 28 functions as a heatsink. The structure 11 is connected to other circuitry by means of pins 52.

Figure 7A:
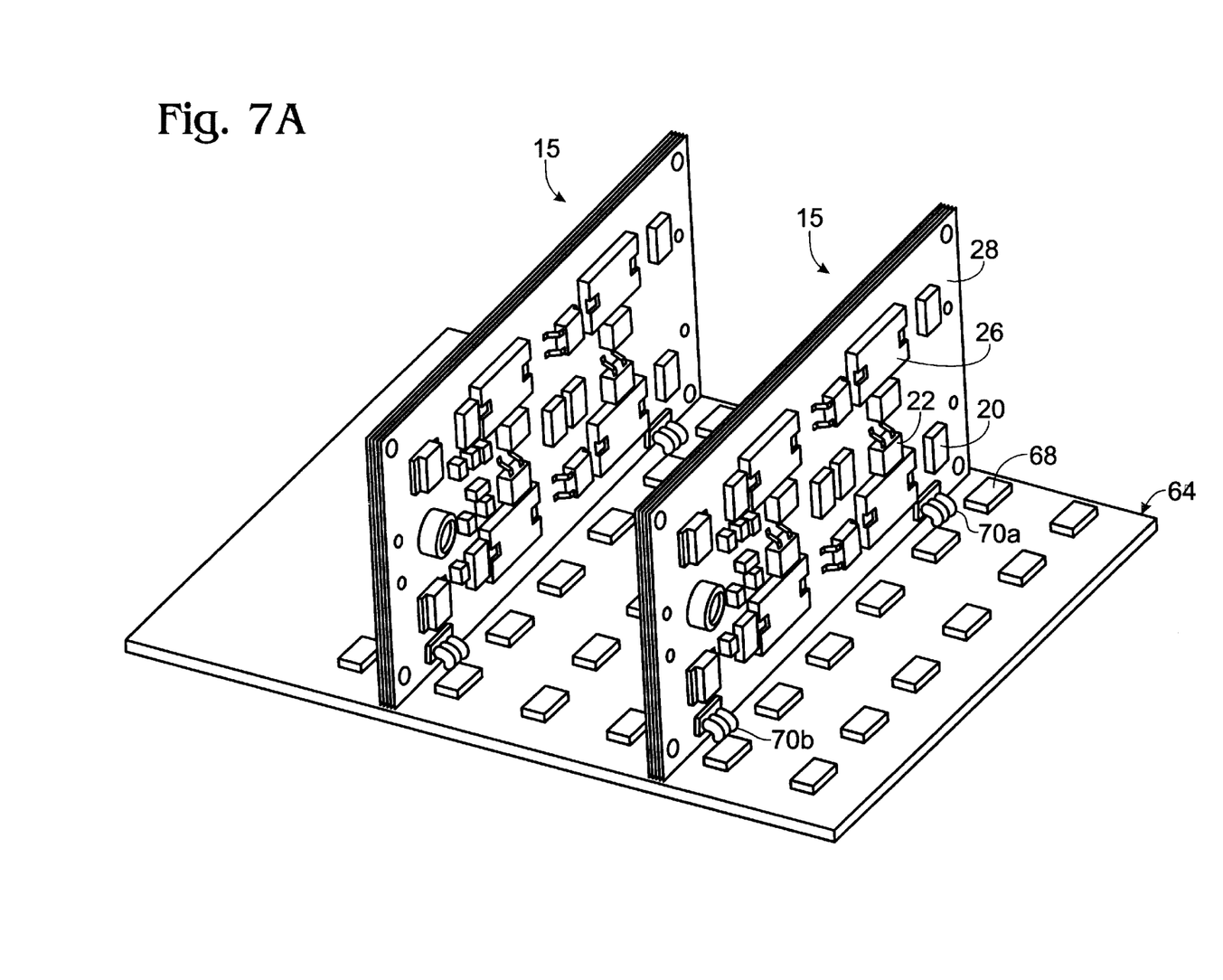
FIG. 7A is a perspective view of the power packages for airflow cooling.

FIG. 7A shows a power system which contains several packaging structures 15 connected to a motherboard 64. As in the structure 7, the structure 15 includes magnetic elements 26, power-dissipating components 22, and low power dissipation components 20. Unlike the structure 7, however, the structure 15 includes neither an insulator 30, nor a base-plate 32. The cooling is accomplished by airflow across which flows in between the packaging structures 15. This maximizes the effective surface available for sinking heat. The structures 15 are connected to a motherboard 64 through signal connectors 70a and power connectors 70b. Supplementary components are located on the motherboard 64.

Figure 7B:
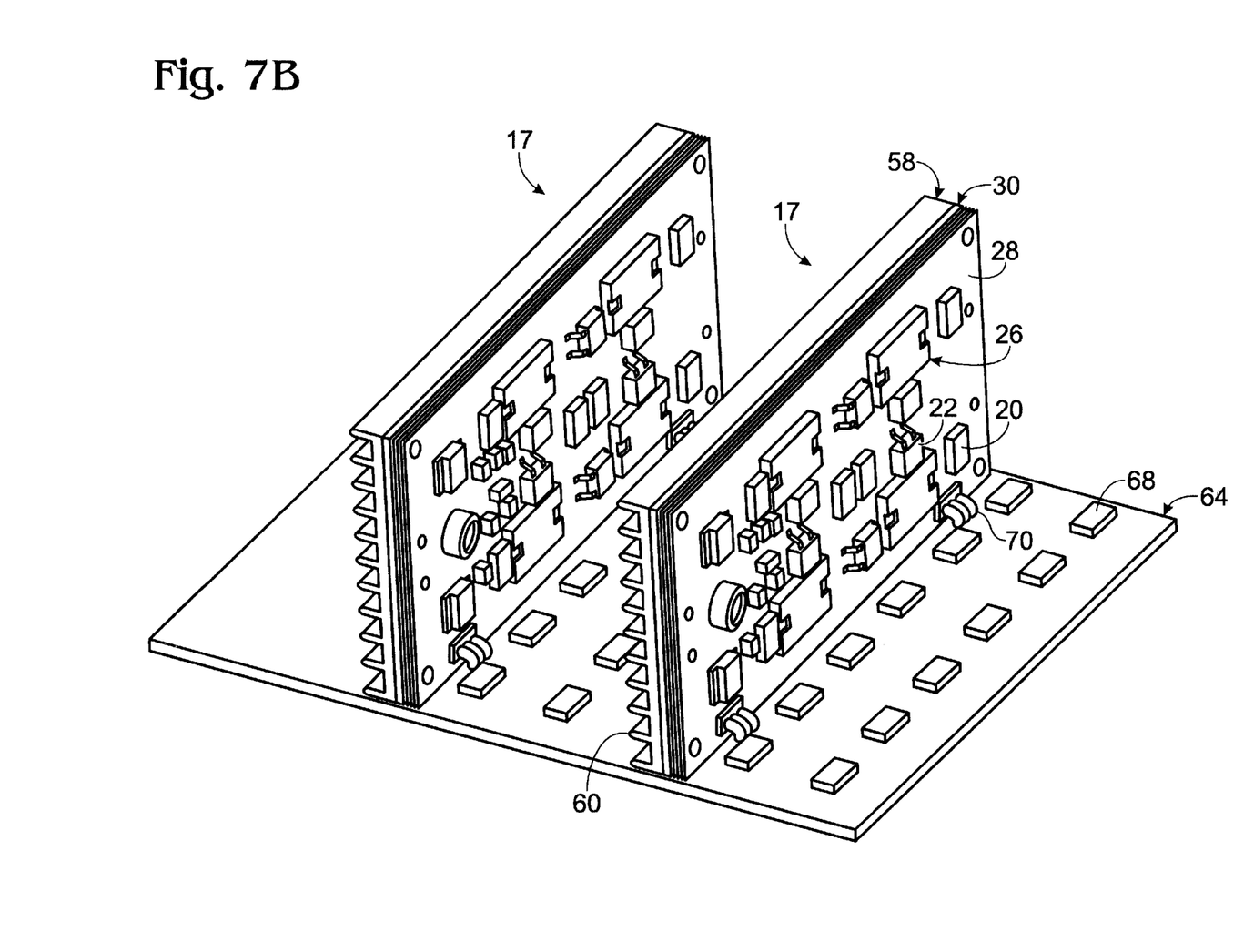
FIG. 7B is a perspective view of the power packages for airflow cooling and additional heat sinking applied to the multilayer circuit board.

FIG. 7B shows two packaging structures 17 connected to the motherboard 64. These packaging structures contain the same components as structure 15 with an additional heat sink 58 attached to the multilayer PCBs 28 through the insulator 30.

Figure 6:
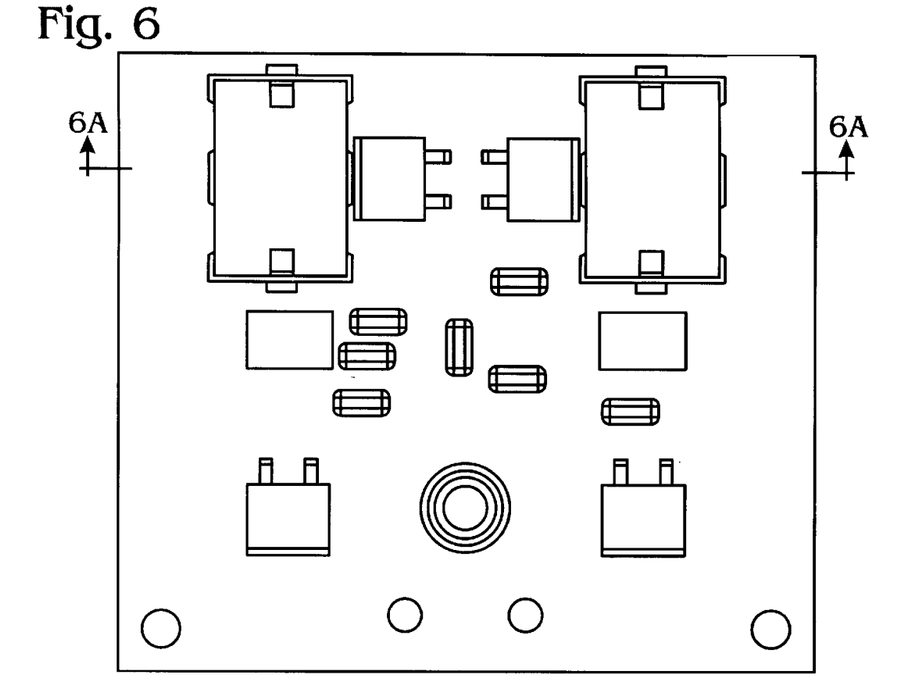
FIG. 6 is a top view of the packaging.
Figure 6A:
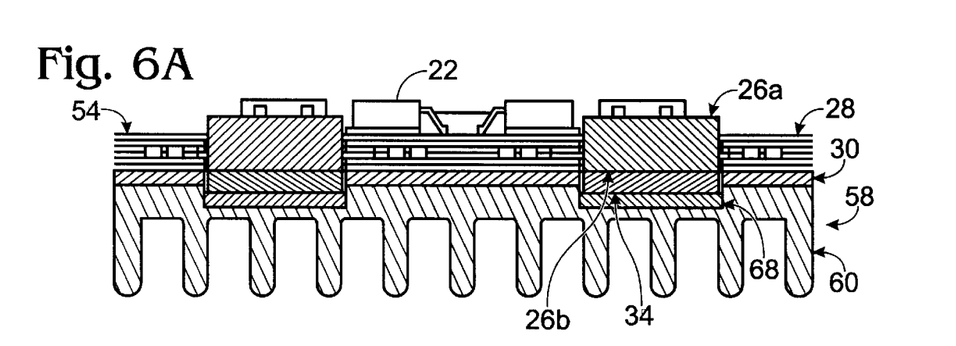
FIG. 6A is a cross-section of the package with cooling by airflow and cavities for magnetic cores.
Figure 6B:
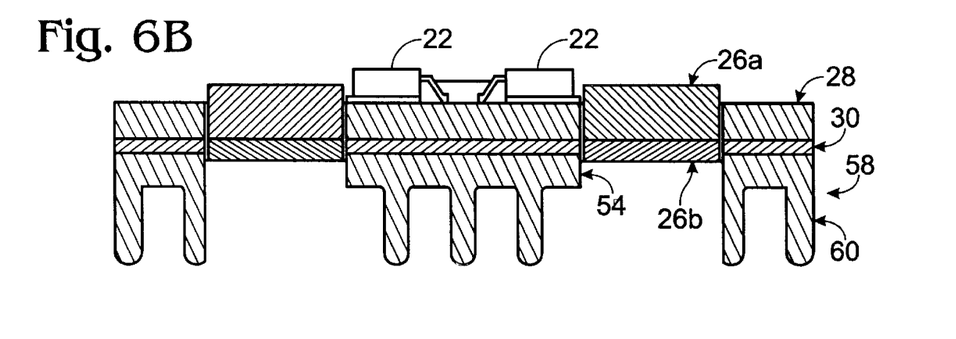
FIG. 6B is a cross-section of the package with cooling by airflow and holes for magnetic cores.

Two types of heatsink construction are shown in FIGS. 6A and 6B. In FIG. 6A a heatsink 58 has cooling fins 60 and cavities 68. A pad 34, formed of a soft compressible material with low thermal impedance, is placed in the cavities. The insulator 30, which has low thermal impedance, is placed between the multilayer PCB 28 and the heat sink 58. Heat is conducted from magnetic core 26b through the pad 34, and from power-dissipating devices through copper plated vias, as in the structure 7.

In FIG. 6B the heatsink 58 with cooling fins 60 has cutouts 64 to accommodate the magnetic core 26b. The cooling of the magnetic cores 26a and 26b is accomplished by airflow across the cooling fins 60. Heat is conducted from the power-dissipating devices to the cooling fins through one or more copper plated vias 42, as in FIG. 4C.

Figure 9:
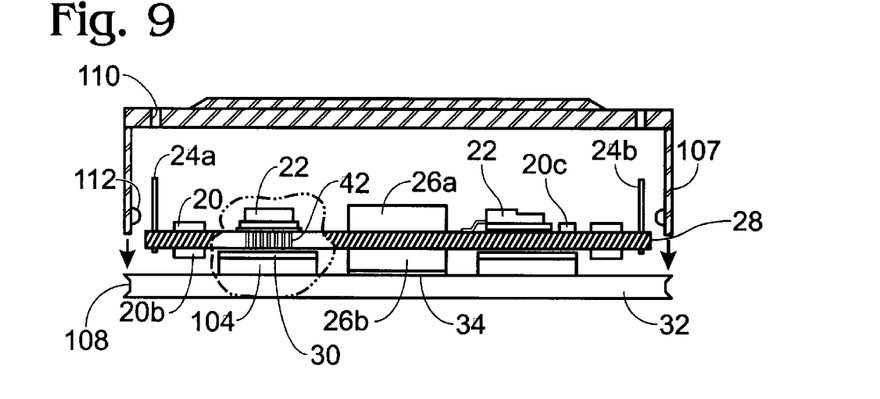
FIG. 9 is another embodiment of the present invention.

FIG. 9 shows a packaging structure wherein the base-plate 32 does not contain cavities. Instead, elevated sections 104 are provided which make contact with the thermally conductive insulator 30 placed under the multilayer PCB 28. The elevated sections 104 are preferably placed under the power-dissipating devices 22 and other low dissipation components 20c which require maintaining a temperature close to that of the base-plate. The pad 34 is placed on the base-plate 32 and supports the magnetic cores 26a and 26b. The height of the elevated section 104 is a function of the height of the magnetic core 26b and the compression ratio of the pad 34. An advantage of the packaging structure is that more components can be mounted on the bottom side 20b of the multilayer PCB. This structure is particularly advantageous for power converters which contain all the control and signal interface functions. The power connectors 24a and 24b provide access to power and signal connections. A cover 107 contains holes 110 to accommodate the power connectors 24a and 24b. Teeth 112 are formed along the lower edge of the cover 107 for attaching it to the base-plate 32 (FIG. 9). A matching groove 108 is undercut into the base-plate 32.

Figure 10A:
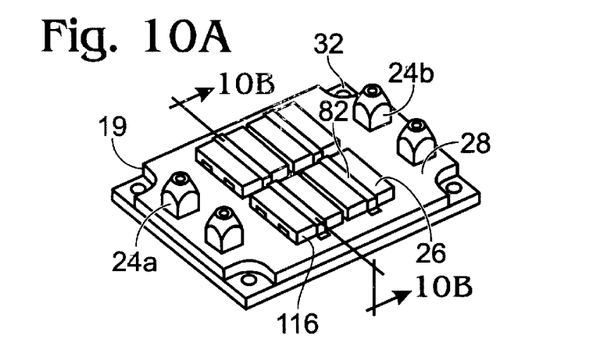
FIG. 10A is a high power magnetics package according to this invention.
Figure 10B:
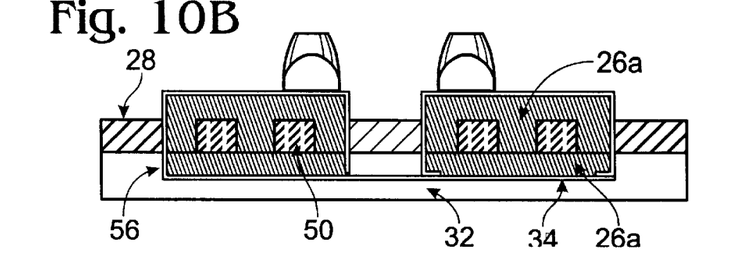
FIG. 10B is a cross-section of the magnetic package presented in FIG. 10A.

FIG. 10A shows a high power magnetic structure 19 wherein the magnetic core comprises several small magnetic cores 26. A cross-section through the structure 19 is shown in FIG. 10B. The windings 50 of the magnetic structure are embedded in the multilayer PCB 28. A cutout 56 in the multilayer PCB 28 is provided to accommodate the magnetic cores 26. Power connectors 24a and 24b are inserted in the multilayer PCB 28 and are connected to the windings 50. The cores 26a and 26b are attached together by means of clips 82. The multilayer PCB 28 also provides support for the magnetic cores 26. A cavity 56 is placed in the base-plate 32. A soft compressible thermally conductive pad 34 is placed between the magnetic core 26b and the base plate 32.

Figure 11:
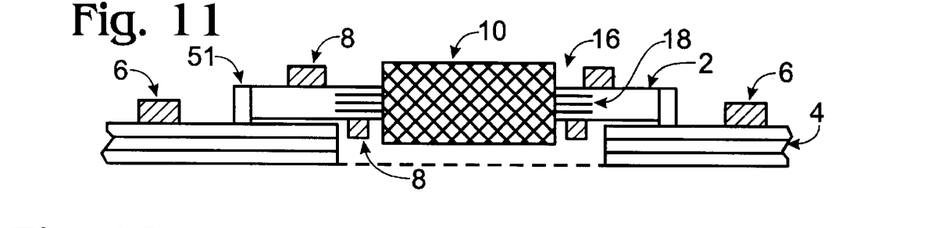
FIG. 11 presents a multilayer PCB which contains the magnetic element and the high frequency switching electronic components of the electronic circuit.

FIG. 11 shows another embodiment of the invention, wherein a multilayer PCB 2 incorporates a winding 18 of a magnetic element 16. The multilayer PCB 2 also supports high frequency switching electronic components 8. The interconnection between the magnetic element 16 and the high frequency switching electronic components 8 is made to minimize both parasitic inductance and insertion impedance. Other electronic components 6 of the electronic circuit are disposed on a mother PCB 4 that can contain a reduced number of layers, reducing cost.

Figure 12:
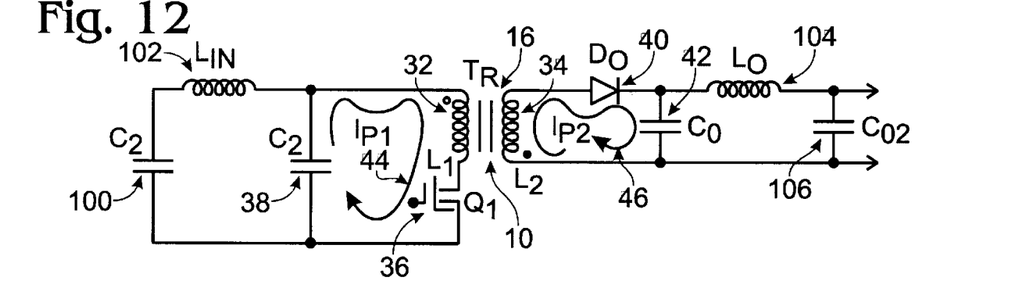
FIG. 12 presents the criteria used to define the high frequency switching electronic components.

FIG. 12 illustrates criteria used to define the high frequency switching electronic components is presented. It is desirable to minimize the size of current loops Lp1 44 and Lp2 46 to improve electrical performance. As a result the components 38, 36, 40 and 42 are preferably located as close as possible to the magnetic element 16. All these elements are disposed on the power PCB 2 (FIG. 11). The rest of the electronic components which process lower frequency signals, such as C2 100, Lin 102, Lo 104 and Co2 106, can be disposed on the mother PCB 4 (FIG. 11).

Figure 13A:
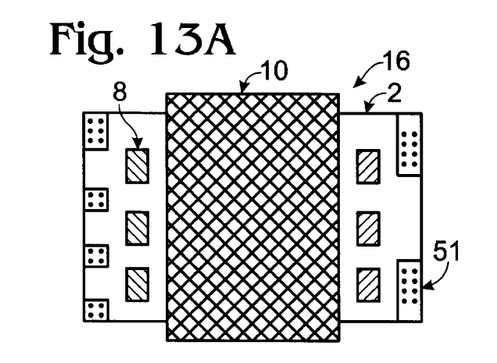
FIG. 13A presents the multilayer PCB structure that incorporates a magnetic element and high frequency electronic components.

FIG. 13A shows the magnetic element 16, the high frequency switching electronic components 8, and the interconnection pads 51.

Figure 13B:
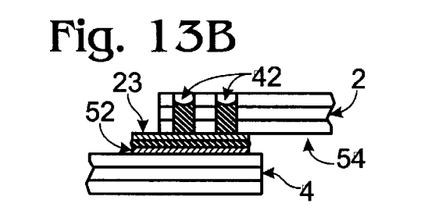
FIG. 13B illustrates a method of attaching the power PCB to the mother PCB using a copper plated via and solder penetrating through the via.

FIG. 13B shows another embodiment of the invention, illustrating a method for attaching the power PCB 2, which supports the magnetic element 16, to the mother PCB 4. The power PCB 2 includes copper plated vias 42, which allow penetration of the solder 23. The solder 23 creates a medium for current flow and also provides a mechanical connection between power PCB 2 and the mother PCB 4. A copper pad 52 is provided on the top of the mother PCB 4, and a copper pad 54 is provided on the bottom of the power PCB 2. During the soldering process, the melted solder 23 spreads between the pads 52 and 54 and further penetrates through the vias 42, creating a mechanical bond and a path for current and heat flow.

Figures 13C, 13D:
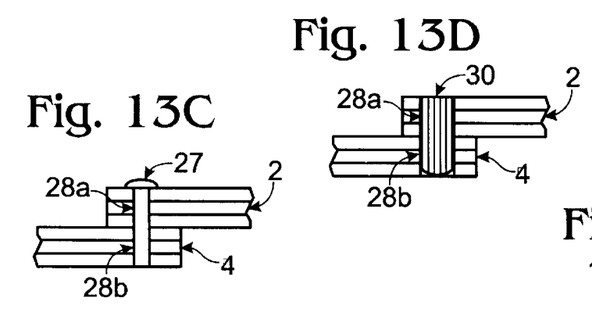
FIG. 13C illustrates a method of attaching the power PCB to the mother PCB using through-hole pins.
FIG. 13D illustrates a method of attaching the power PCB to the mother PCB using a pressed insert.

FIG. 13C shows another embodiment of the invention wherein the interconnection between the power PCB 2 and the mother PCB 4 is accomplished with a pin 27 which is pressed into vias 28a and 28b respectively of the power PCB 2 and the mother PCB 4, and is further soldered to the mother PCB 4.

FIG. 13D shows the interconnection between the power PCB 2 and the mother PCB 4 accomplished with the use of a pressed insert 30. The insert 30 is formed of a conductive material to create a path for current and heat, in addition to a mechanical connection.

Figure 13E:
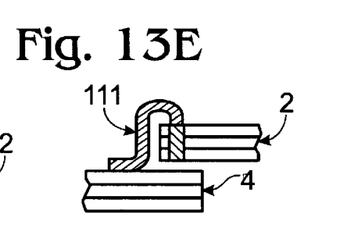
FIG. 13E illustrates a method of attaching the power PCB to the mother PCB using surface-mounted pins.

FIG. 13E shows another embodiment of the invention wherein a surface-mounted pin 111 is used for interconnecting the power PCB 2 and the mother PCB 4. The pin 111 is electrically and thermally conductive to allow an efficient current and heat flow between the power PCB 2 and the mother PCB 4.

Figure 13F:
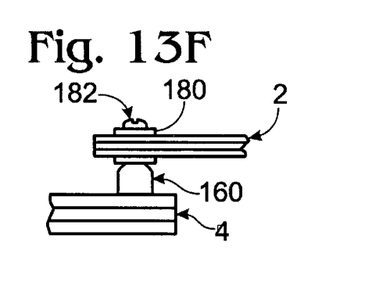
FIG. 13F illustrates a method of attaching the power PCB to the mother PCB using two pressed inserts and a screw.

FIG. 13F shows another embodiment of the invention wherein the interconnection between the power PCB 2 and the mother PCB 4 is provided by pressed connectors 160 and 180 and a screw 182. The connector 160 is press fit into the mother PCB 4 and the connector 180 is press fit into the power PCB 2. The screw 182 ensures mechanical interconnection between the connectors 160 and 180. The connectors 160 and 180 provide very good conduction of current and heat, creating a very low electrical and thermal impedance path between the power PCB 2 and the mother PCB 4.

Figure 14:
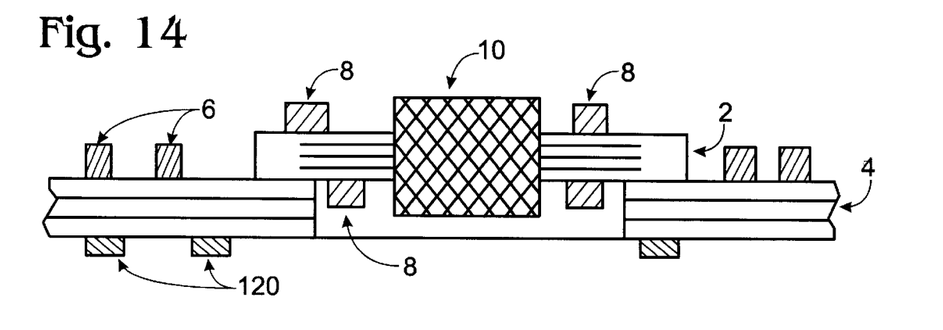
FIG. 14 shows the same structure depicted in FIG. 11 wherein surface-mounted components are placed on both sides of the mother PCB.

FIG. 14 shows an embodiment of the invention wherein components 120 are disposed on the bottom side of the mother PCB 4. The power density of the power-processing device formed by the power PCB, mother PCB, high frequency switching electronic components, and the rest of the electronic components, may thereby be increased.

Figure 15A:
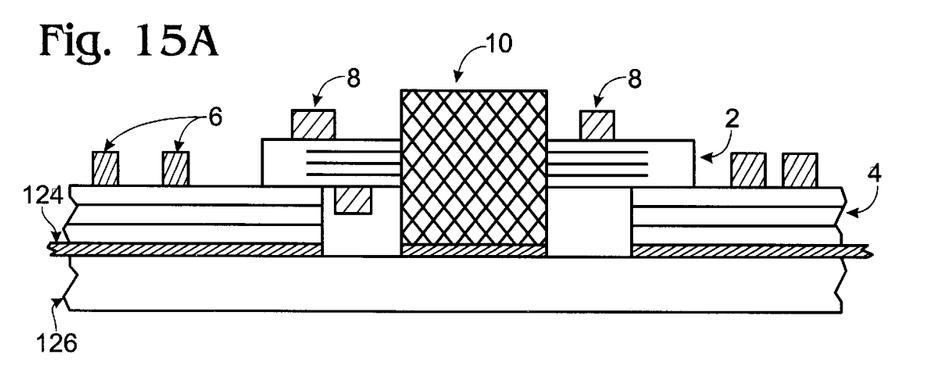
FIG. 15A shows the same structure depicted in FIG. 11 wherein a cooling plate is attached to the mother PCB.

FIG. 15A shows an additional metal plate 126 attached to the mother PCB 4 through a dielectric material 124. Heat flows from the mother PCB to the metal plate 126 which functions as a heatsink.

Figure 15B:
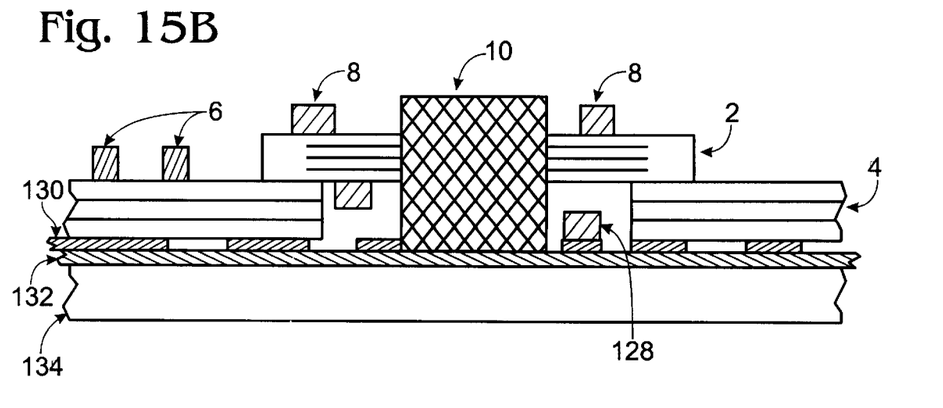
FIG. 15B shows the same structure depicted in FIG. 15A wherein the cooling plate is replaced by an isolated metal substrate, wherein surface-mounted components are placed in the space between the power PCB and the isolated metal substrate.

FIG. 15B shows another embodiment of the invention wherein a metal substrate element element comprising a metal plate 134, a dielectric 132, and a copper foil 130, is attached to the mother PCB 4. Additional electronic components 128 can be attached to copper pads on the copper foil 130. This packaging method allows heat from the power PCB 2 and the mother PCB 4 to flow to the metal plate 134. Providing for the additional components 128 leads to increased power density.

Figure 15C:
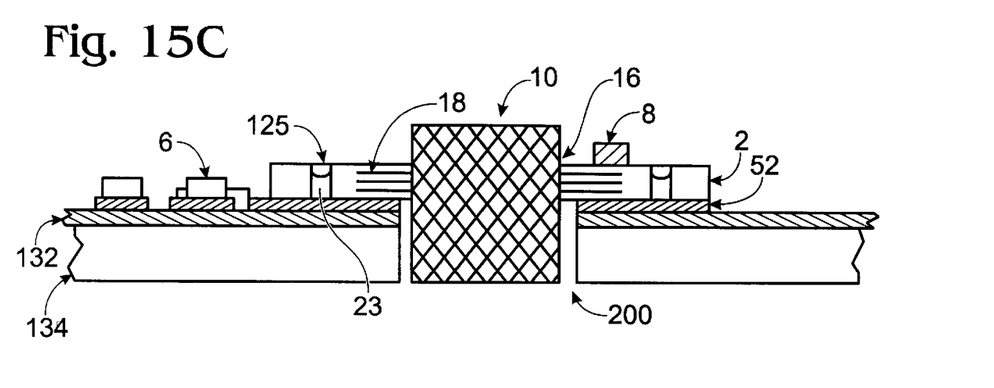
FIG. 15C shows an embodiment wherein the magnetic element is attached to an isolated metal substrate composed of a dielectric material, copper foil, and metal plate.

FIG. 15C shows an embodiment of the invention in which a magnetic element 16 is attached to an isolated metal substrate comprising the dielectric material 132, copper foil 52, and the metal plate 134. A cutout 200 in the metal substrate is provided to accommodate the magnetic core 10. The interconnection between the metal substrate and the magnetic element 16 is made with the copper foil 52 and a via 125. In the soldering process, melted solder 23 penetrates through the via 125, creating an electrical and mechanical bond. The advantage of this embodiment is that high power dissipation devices are disposed directly on the metal substrate, resulting in very low thermal impedance to the metal plate 134.

Figure 16:
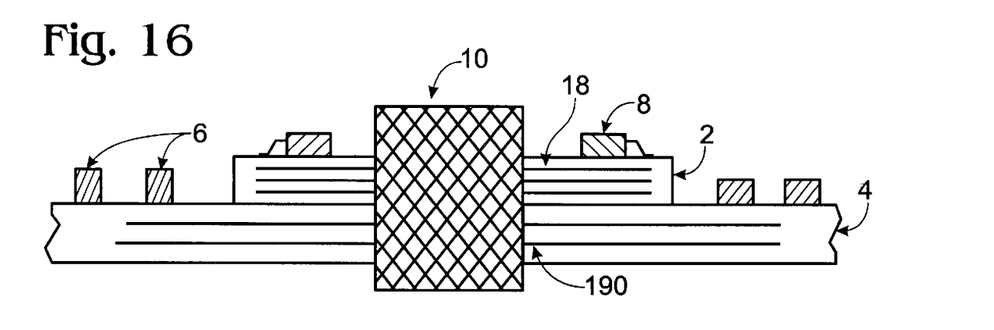
FIG. 16 shows another embodiment of this invention wherein the magnetic core extends through both the power PCB and the mother PCB.

FIG. 16 shows a magnetic core 10 penetrating through the power PCB 2 and the mother PCB 4. Windings 18 in the layers of the power PCB 2 and windings 190 in the mother PCB 4 are magnetically coupled. This increases the number of electronic components that can be attached to the mother PCB 4.

Figure 17:
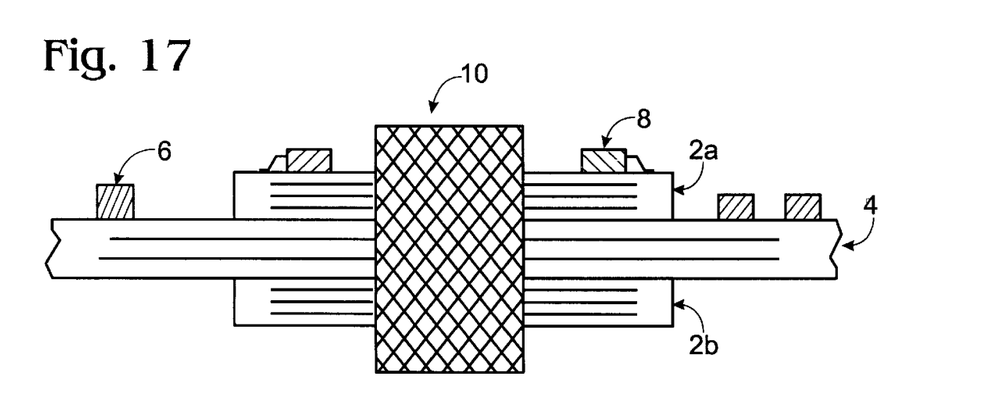
FIG. 17 shows another embodiment of this invention wherein the magnetic core extends through several PCBs.

FIG. 17 shows two power PCBs 2a and 2b linked magnetically through a magnetic core 10 to the mother PCB 4. This symmetrical structure offers some advantages such as interleaving the primary and secondary windings of the magnetic structure using the magnetic core 10.

Figure 18:
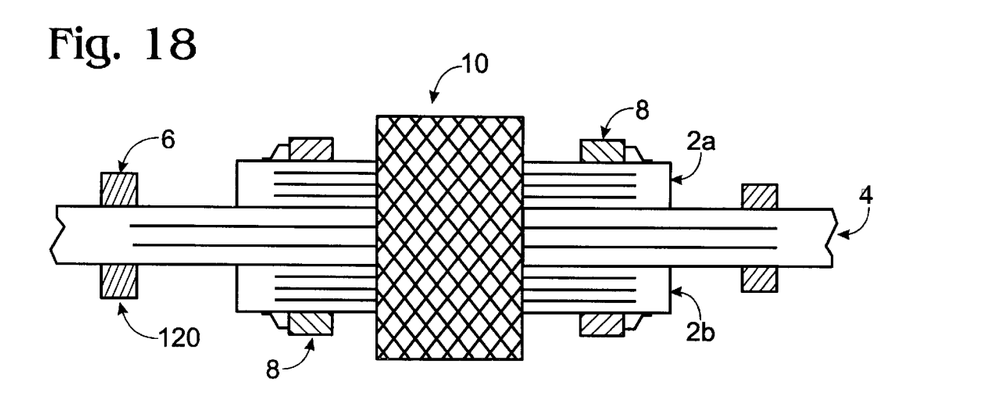
FIG. 18 shows another embodiment of this invention wherein the magnetic core extends through several power PCBs which contain high frequency switching electronic components, and through the mother PCB.

FIG. 18 shows high frequency switching electronic components disposed on both power PCBs 2a and 2b. The primary winding of the transformer element using the magnetic core 10 can be disposed on the mother PCB 4, and the secondary winding can be disposed in the power PCBs 2a and 2b. Additional high frequency switching electronic components such as rectifiers can be surface-mounted on the PCBs.

Figure 19:
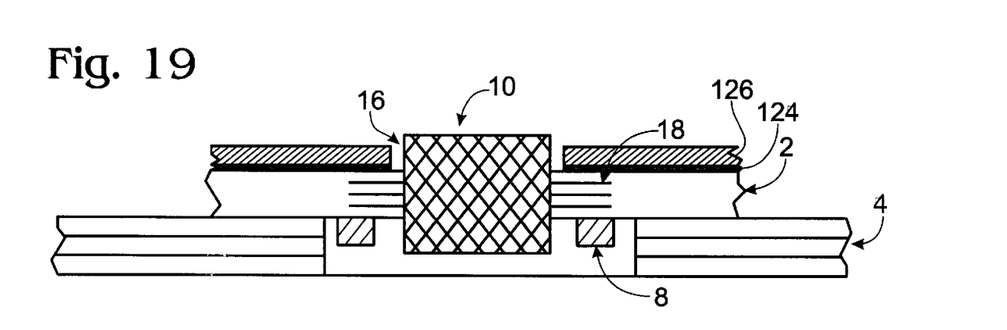
FIG. 19 shows another embodiment of this invention wherein a metal plate is attached to the power PCB.

FIG. 19 shows an additional metal plate 126 attached to the power PCB 2 by way of an intermediating dielectric material 124. Heat produced by the magnetic element 16 and by the high frequency switching electronic components 8 can be transferred to the metal plate 126 and further transferred to the air or an additional heatsink.

Figure 20:
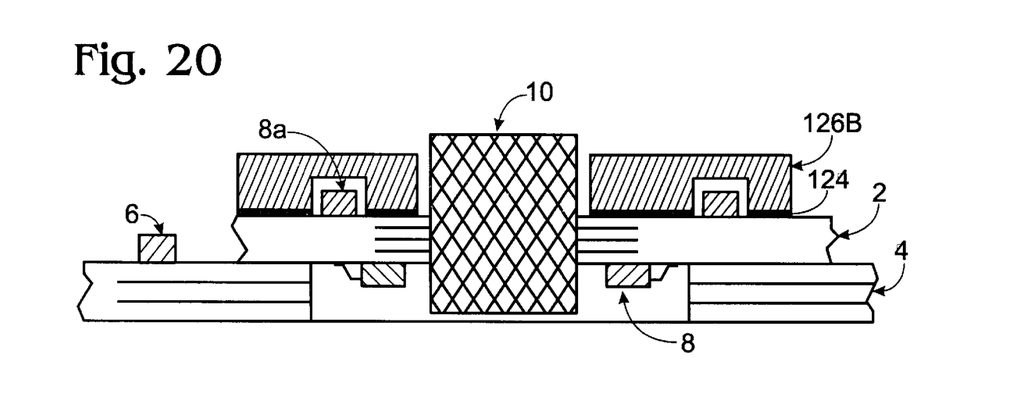
FIG. 20 shows another embodiment of this invention wherein a metal plate with cavities to accommodate some of the high frequency switching electronic components is attached to the power PCB.

FIG. 20 shows a similar concept to that of FIG. 19, where some of the high frequency switching electronic components are located under a metal plate 126B. The metal plate 126B includes cavities to accommodate components 8A disposed on top of the power PCB 2.

Figure 21:
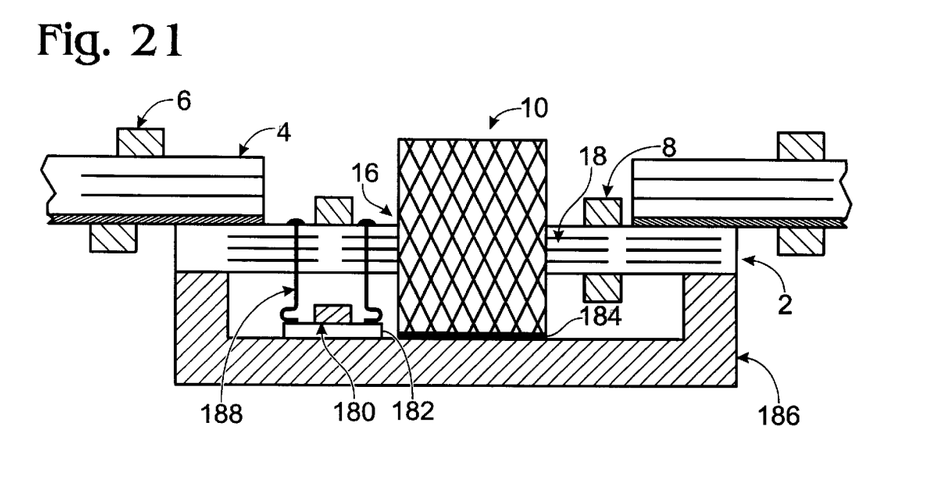
FIG. 21 shows another embodiment of this invention wherein some of the high heat dissipation components are located on an alumina substrate placed on a metal plate.

FIG. 21 shows high power dissipation electronic components 180 disposed on an alumina substrate 182. Interconnection between the alumina substrate 182 and the power PCB 2 is provided by pins 188. A thermally conductive compressible pad 184 is placed between the magnetic core 10 and the metal plate 186. The module comprising the power PCB 2, the high frequency switching electronic components 8 and 180, and the metal plate 186, is attached to the mother PCB 4. The advantage of this structure is that a good thermal path from the high heat dissipation components to the metal plate heatsink 186 is provided.

Figure 22:
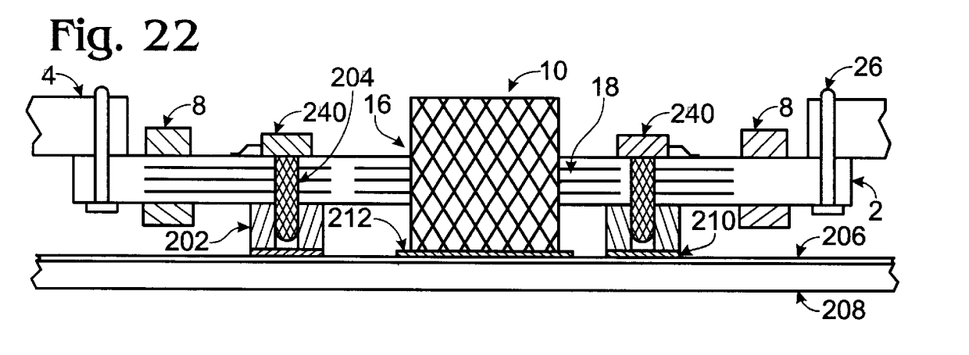
FIG. 22 shows another embodiment of this invention wherein the high heat dissipation components are located on top of a thermally conductive insert further soldered to a copper foil edged on an isolated metal substrate board.

FIG. 22 shows high heat dissipation components 240 disposed on top of a heat conductive insert 204. The insert 204 penetrates into a copper interface 202. The copper interface 202 is soldered to copper foil 210 disposed on a dielectric 206, which is attached to a metal plate 208. The structure comprising the heat conductive insert 204, copper interface 202, and the copper foil 210 can efficiently transfer heat from the components 240 to the metal plate 208. This structure also provides an efficient path for current flow. A power processing module comprising the power PCB 2, high frequency switching electronic components such as 8 and 240, the heat conductive insert 204, the copper interface 202, copper foil 210, the dielectric layer 206, and the metal plate 208, can be connected to the mother PCB 4.

Figure 23:
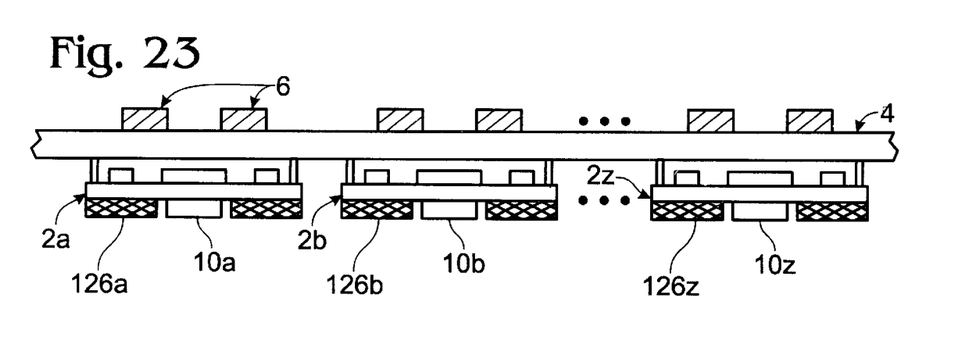
FIG. 23 shows another embodiment of the invention wherein multiple power PCBs contain high frequency switching electronic components for power processing cells.

FIG. 23 shows another embodiment of the invention wherein multiple power PCBs 2A . . . 2Z are provided. Each power PCB includes at least one magnetic element along with high frequency switching electronic components and high power dissipation components. Additional electronic components, such as components for signal control, are disposed on the mother PCB 4. Cooling plates 126A . . . 126Z can be further attached to the respective power PCBs for cooling. The high power dissipation components, which in most power converters are also high frequency switching components, are thereby separated from the noise and heat sensitive components located on the mother PCB.

Power PCBs are relatively costly compared to the mother PCB because of their typically large number of layers. According to the invention, some of the electronic components that would ordinarily be supported by the power PCBs are moved to the mother PCB, allowing for a reduction in the size of the PCBs, reducing overall cost. Further, separating the high frequency switching and high power dissipation electronic components from the rest of the components leads to improved electrical-thermal characteristics. The number of power PCBs provided can be increased to increase the output power, the PCBs functioning as standardized power-processing cells that constitute the building blocks for a power system having any desired power output.

It is clear that the present invention provides for a highly improved transformer.

What is claimed is:

1. An electronic assembly comprising:

a) an electronic board having an opening therein, said electronic board further including at least two pads positioned on a first surface of said electronic board proximate to said opening;

b) a multilayer circuit board having secured thereto a transformer, said multilayer circuit board positioned such that a portion of a first surface of said multilayer circuit board engages the first surface of said electronic board such that a portion of a core of said transformer extends into said opening, said multilayer circuit board having at least two channels therethrough, each of said channels aligned with one of said at least two pads;

c) solder extending through said at least two channels in said multilayer circuit board, said solder bonded to said channels and associated pads on said electronic board; and d) at least one electronic component secured to an opposing second surface of said multilayer circuit board.

2. The electronic assembly according to claim 1, further including at least one electronic component secured to the first surface of said multilayer circuit board and enclosed within said opening in said electronic board.

3. The electronic assembly according to claim 2, wherein, during operation of said electronic assembly, electrical current passes through said solder extending through said at least two channels in said multilayer circuit board.

4. The electronic assembly according to claim 3, a) wherein said multilayer circuit board includes at least two aligning pins; and, b) wherein said electronic board includes at least two alignment holes adapted to receive said at least two aligning pins of said multilayer circuit board.

5. The electronic assembly according to claim 4, wherein said at least two aligning pins are not bonded with the at least two alignment holes of said electronic board.

6. An electronic assembly comprising:

a) an electronic board having an opening therein, said electronic board further including at least two pads positioned on a first surface of said electronic board proximate to said opening;

b) a multilayer circuit board having secured thereto a transformer, said multilayer circuit board positioned such that a portion of a first surface of said multilayer circuit board engages the first surface of said electronic board such that a portion of a core of said transformer extends into said opening, said multilayer circuit board having at least two channels therethrough, each of said channels aligned with one of said at least two pads;

c) solder extending through said at least two channels in said multilayer circuit board, said solder bonded to said channels and associated pads on said electronic board; and d) high frequency switching electronic components located on said multilayer circuit board, said high frequency switching electronic components feeding primary and secondary high frequency loops of said transformer.

7. A transformer assembly comprising:
a) a multilayer circuit board having at least two channels therethrough;
b) a transformer formed in said multilayer circuit board, a portion of a core of said transformer extending therethrough;
c) an electronic board having an opening therein, said electronic board further including at least two pads positioned on a first surface thereof proximate said opening, wherein a portion of a first surface of said multilayer circuit board is adapted to engage the first surface of said electronic board such that a portion of said core of said transformer extends into said opening, wherein each of said channels is adapted to be aligned with respective pads of said electronic board, and wherein said multilayer circuit board is adapted to be secured to said electronic board using solder extending through each of said channels and bonded to said pads; and
d) at least one electronic component secured to a second surface of said multilayer circuit board.

8. The transformer assembly according to claim 7, wherein said portion of said first surface of said multilayer circuit board engages the first surface of said electronic board, the assembly further including at least one electronic component secured to the first surface of said multilayer circuit board and enclosed within said opening in said electronic board.

9. The transformer assembly according to claim 8, wherein, during operation of said transformer, electrical current passes through solder in said channels.

10. The transformer assembly according to claim 9, wherein said multilayer circuit board includes at least two aligning pins adapted to engage alignment holes in said electronic board.

11. A transformer assembly comprising:
a) a multilayer circuit board having at least two channels therethrough;
b) a transformer formed in said multilayer circuit board, a portion of a core of said transformer extending therethrough;
c) an electronic board having an opening therein, said electronic board further including at least two pads positioned on a first surface thereof proximate said opening, wherein a portion of a first surface of said multilayer circuit board is adapted to engage the first surface of said electronic board such that a portion of said core of said transformer extends into said opening, wherein each of said channels is adapted to be aligned with respective pads of said electronic board, and wherein said multilayer circuit board is adapted to be secured to said electronic board using solder extending through each of said channels and bonded to said pads; and
d) one or more high frequency switching electronic components located on said multilayer circuit board, said high frequency switching electronic components feeding primary and secondary high frequency loops of said transformer.

12. An electronic assembly comprising:
a) an electronic board having an opening therein, said electronic board further including at least two pads positioned on a first surface of said electronic board proximate to said opening, said electronic board further having at least two electronic elements thereon;
b) a multilayer circuit board having,
   1) a transformer, a core of said transformer extending through said multilayer circuit board,
   2) a first surface engaging the first surface of said electronic board such that a portion of said core of said transformer extends into the opening of said electronic board,
   3) at least two channels extending through said multilayer circuit board, each of said channels aligned with one of said at least two pads of said electronic board, and
   4) at least one electronic component secured to a second surface of said multilayer circuit board;
c) solder extending through said at least two channels in said multilayer circuit board, said solder bonded to the channel and to an associated pad on said electronic board; and
d) wherein said transformer electrically communicates with said at least two electronic elements of said electronic board via solder in said at least two channels.

13. The electronic assembly according to claim 12,
a) further including at least one electronic component secured to the first surface of said multilayer circuit board and enclosed within said opening in said electronic board; and,
b) wherein said at least one electronic component secured to the first surface of said multilayer circuit board electrically communicates with said at least two electronic elements of said electronic board via said solder in said at least two channels.

14. The electronic assembly according to claim 12, further including magnetic loop components located on said multilayer circuit board, said magnetic loop components feeding primary and secondary high frequency loops of said transformer.

* * * * *